United States Patent
Chen

(10) Patent No.: US 9,519,024 B2
(45) Date of Patent: Dec. 13, 2016

(54) APPARATUS FOR TESTING PACKAGE-ON-PACKAGE SEMICONDUCTOR DEVICE AND METHOD FOR TESTING THE SAME

(71) Applicant: CHROMA ATE INC., Kueishan Hwaya Technical Park, Taoyuan County (TW)

(72) Inventor: Chien-Ming Chen, Taoyuan County (TW)

(73) Assignee: CHROMA ATE INC., Kueishan Hwaya Technical Park, Taoyuan County (TW)

( * ) Notice: Subject to any disclaimer, the term of this patent is extended or adjusted under 35 U.S.C. 154(b) by 73 days.

(21) Appl. No.: 14/617,892

(22) Filed: Feb. 9, 2015

(65) Prior Publication Data

US 2015/0226794 A1    Aug. 13, 2015

(30) Foreign Application Priority Data

Feb. 10, 2014    (TW) .............................. 103104192 A

(51) Int. Cl.
 *G01R 31/28* (2006.01)
 *G01R 1/04* (2006.01)

(52) U.S. Cl.
 CPC ......... *G01R 31/2893* (2013.01); *G01R 1/0433* (2013.01); *G01R 31/2867* (2013.01); *G01R 31/2887* (2013.01); *G01R 31/2896* (2013.01)

(58) Field of Classification Search
 CPC ............ G01R 31/2865; G01R 31/2867; G01R 31/2893; G01R 31/318513

(Continued)

(56) References Cited

U.S. PATENT DOCUMENTS 7,427,768 B2 *   9/2008   Kim
7,486,525 B2 *   2/2009   Knickerbocker
(Continued)

FOREIGN PATENT DOCUMENTS

JP     2009030978 A    2/2009
KR     100939302 B1    1/2010
(Continued)

OTHER PUBLICATIONS

TW Opinion of Examination, Jan. 18, 2016.
Korean Office Action, Oct. 15, 2015.
Korean Notice of Allowance, Apr. 28, 2016.

*Primary Examiner* — Walter L Lindsay, Jr.
*Assistant Examiner* — Milton Gonzalez
(74) *Attorney, Agent, or Firm* — Bui Garcia-Zamor; Jessica H. Bui, Esq.

(57) ABSTRACT

An apparatus for testing a package-on-package semiconductor device comprises a pick and place device for loading a first chip into or unloading the first chip from a test socket and a lifting and rotating arm for moving a chip placement module which receives a second chip to a position between the pick and place device and the test socket. The pick and place device and the chip placement module are lowered, and then a test process is performed. After the test process is completed, the pick and place device and the chip placement module are lifted, and the lifting and rotating arm moves the chip placement module to one side of the pick and place device. Accordingly, a method for testing the semiconductor device could be performed automatically so as to greatly enhance test efficiency and accuracy and to significantly reduce costs.

10 Claims, 7 Drawing Sheets

(58) Field of Classification Search
USPC .......................... 324/757.01–757.05, 762.06
See application file for complete search history.

(56) References Cited

U.S. PATENT DOCUMENTS

| | | | |
|---|---|---|---|
| 2013/0293252 A1* | 11/2013 | Chen | |
| 2013/0293254 A1* | 11/2013 | Chen | |
| 2014/0159758 A1* | 6/2014 | Bhatt | |
| 2014/0312926 A1* | 10/2014 | Qi ...................... | G01R 31/2893 |
| | | | 324/757.04 |

FOREIGN PATENT DOCUMENTS

| | | |
|---|---|---|
| KR | 101105866 B1 | 1/2012 |
| TW | M361021 U1 | 7/2009 |
| TW | 201007188 | 2/2010 |
| TW | M396483 U1 | 1/2011 |
| TW | M408039 U1 | 7/2011 |
| TW | 201346289 A | 11/2013 |
| TW | 201350882 A | 12/2013 |

* cited by examiner

APPARATUS FOR TESTING PACKAGE-ON-PACKAGE SEMICONDUCTOR DEVICE AND METHOD FOR TESTING THE SAME

BACKGROUND OF THE INVENTION

Field of the Invention

The invention relates to an apparatus for testing a package-on-package semiconductor device and a method for testing the same, and particularly, suitable for testing electrical characteristics and functions of the package-on-package semiconductor device.

Description of the Related Art

With the wide spread use of mobile multimedia products and the urgent requirements for electronic device having higher digital signal processing performance, higher storage capacity, and flexibility demand for, the stacked package on package (PoP) to semiconductor device is growing rapidly.

FIG. 5 schematically shows a general stacked semiconductor package 9. The so-called package-on-package technology means that two or more elements are packaged in a way of vertical stacking or back carrying. As shown in FIG. 5, generally, the package 9 comprises a bottom chip 91 and a top chip 92, wherein the bottom chip 91 is typically an integrated digital or mixed signal logic chip, for example, a baseband process or a multimedia processor, and the top chip 92 is typically an integrated memory chip, for example, DRAM or Flash memory. Accordingly, the advantages of the stacked package reside in compacting the package so as to reduce the whole volume, simplifying the circuitry of the mother board, as compared with the conventional side-by-side package, and improving the frequency performance by the direct connection of a memory chip with a logic circuit.

As to a test process for a general package-on-package semiconductor device, the top chip 92 and the bottom chip 91 are tested, individually, before they are packaged. If the electrical functions of the two chips are verified by the test process functions, then the steps of stacking, wire bonding and packaging are performed to complete a final product. Typically, the test of the electrical functions of the bottom chip 91 has to cooperate with the top memory chip. As such, the test of the bottom chip 91 becomes significantly more complicated, as compared with the test of a single chip.

That is to say, in the conventional test process, the top chip 92 and the bottom chip 91 are aligned up by means of eye estimation, and the test process is performed manually. However, such a test process performed manually would cause a test failure easily due to misjudgment or fault of operation from testing personnel, thereby reducing the test accuracy and consuming costs. Additionally, the efficiency of the manual test can not be promoted further.

It can be seen from the above description of the related art in this industry, there is practically an urgent requirement to accomplish an apparatus for a package-on-package semiconductor device and a test method for testing the same, which can be carried out automatically so as to greatly promote test efficiency and accuracy, that is to say, significantly reduce production costs.

SUMMARY OF THE INVENTION

An objective of the present invention is to provide an apparatus for testing a package-on-package semiconductor device and a method for testing the same by which testing the bottom chip of the package-on-package semiconductor device can be performed automatically so as to greatly promote the test efficiency and test accuracy and to significantly reduce costs.

To achieve the above objective, an apparatus for testing a package-on-package semiconductor device of the present invention primarily comprises a main controller, a pick and place device, a test socket, a lifting and rotating arm, and a chip placement module, wherein the test socket is provided to receive a first chip, and the test socket is located under the pick and place device; the lifting and rotating arm is located on one side of the pick and place device; the chip placement module is provided on the lifting and rotating arm, the chip placement module receives a second chip, the bottom surface of the chip placement module is provided with a plurality of contact terminals, and the second chip is electrically connected to the plurality of contact terminals. Moreover, the main controller is electrically connected to pick and place device, the test socket, the lifting and rotating arm, and the chip placement module; the main controller is configured to control the pick and place device to load the first chip into or unload the same out of the test socket; control the lifting and rotating arm to move the chip placement module to a position between the pick and place device and the test socket or adjacent to the pick and place device and control the pick and place device to lower the chip placement module so that the plurality of contact terminals electrically contact the first chip on the test socket for performing a test.

Accordingly, the apparatus for testing a package-on-package semiconductor device of the present invention primarily drives the chip placement module which receives the second chip to selectively move to a position between the pick and place device and the test socket or a position adjacent to the pick and place device by means of the lifting rotating arm, so that the pick and place device can transfer a chip and lower it to cooperate with the chip placement module for performing a test process.

Preferably, the bottom surface of the pick and place device of the present invention is provided with a suction head; the main controller is configured to control the chip placement module to move to the position between the pick and place device and the test socket so as to join the bottom surface of the pick and place device and control the suction head to suck the second chip. Accordingly, in addition to picking and placing the first chip, the suction head of the present invention serves as a sensing device for judging whether the chip placement module joins the pick and place device completely or not. In details, when the chip placement module joins the pick and place device together, using the suction head to suck the second chip can judge whether the chip placement module joins the pick and place device completely or not. If the chip placement module does not join the pick and place device completely, there must be a gap remaining between the top surface of the second chip and the suction head. Hence, they are not in close fit to form a negative pressure, that is, there is a join error. Therefore, it assists in judging the join state between the chip placement module and the pick and place device.

The apparatus of the present invention further comprises a position sensor, which is provided on the lifting and rotating arm and electrically connected to the main controller. The position sensor can detect the actual position of the chip placement module or sense the action or orientation of the lifting and rotating arm, thereby assisting in positioning with the chip placement module.

Still, the apparatus of the present invention further comprises a chip shuttle, which is electrically connected to the main controller; the main controller is configured to control the chip shuttle to selectively move to a position between the pick and place device and the test socket or more away from the pick and place device, and the chip shuttle is used to carry the first chip. Accordingly, in the present invention, the first chip which is to be tested or already tested is carried by the chip shuttle and then picked by the pick and place device, thereby enhancing the chip carrying efficiency.

It is preferable that the chip placement module of the apparatus of the present invention comprises a cushion and a chip shuttle. The cushion is provided on the chip shuttle, and the second chip is received in the chip shuttle. That is, when the chip placement module joins the pick and place device, a collision between them can be efficiently prevented by cushioning effect.

The pick and place device of the equipment of the present invention still further comprises an air damper, under which the suction head is disposed. Accordingly, the present invention can prevent a collision between the devices by the air damper when the pick and place device places the first chip, or the pick and place device joins the chip placement module, or the pick and place device lowers down for performing a test process.

For achieving the above objective, a method for testing a package-on-package semiconductor device of the present invention comprises the following steps: loading a first chip into a test socket by a pick and place device; moving a chip placement module to a position between the pick and place device and the test socket by a lifting, and rotating arm, the chip placement module receiving a second chip, a bottom surface of the chip placement module being provided with a plurality of contact terminals, and the second chip electrically being connected to the plurality of contact terminals; lowering the pick and place device and the chip placement module so that the plurality of contact terminals are electrically contacted to the first chip on the test socket for performing a testing; lifting the pick and place device and the chip placement module and moving the chip placement module to one side of the pick and place device by the lifting and rotating arm; finally, unloading the first chip which is already tested out of the test socket by the pick and place device.

Accordingly, in the method for testing a package-on-package semiconductor device of the present invention, the chip placement module receiving the second chip can be selectively moved to a position between the pick and place device and the test socket or a position adjacent to the pick and place device, so that the pick and place device can be lowered down and cooperate with the chip placement module to electrically contact the second chip to the first chip for performing a test or transfer and pick a chip.

It is preferable that the bottom surface of the pick and place device of the present invention is provided with a suction head; when the chip placement module is selectively moved to a position between the pick and place device and the test socket, the chip placement module joins the bottom surface of the pick and place device and the suction head correspondingly sucks the second chip. In other words, the fact whether the chip placement module joins the pick and place device completely or not can be thereby determined to assist in the alignment between the chip placement module and the pick and place device.

According to the method of the present invention, in the step of moving the chip placement module to a position between the pick and place device and the test socket, the lifting and rotating arm swings the chip placement module to the position between the pick and place device and the test socket, the lifting and rotating arm can lift the chip placement module to joint the bottom surface of the pick and place device. Of course, the present invention is not limited to this. A way of lowering the pick and place device to joint with the chip placement module can be adopted to.

Furthermore, in the method of the present invention, after the pick and place device lifts together with the chip placement module, the lifting rotating arm lowers the chip placement module to detach it the chip placement module therefrom, and then swings the chip placement module out to one side of the pick and place device. Of course, the present invention is not limited to this. A way of lifting the pick and place device and detaching directly and keeping the chip placement module stationary can be also adopted to.

DESCRIPTION OF THE PREFERRED EMBODIMENTS

Figure 1:
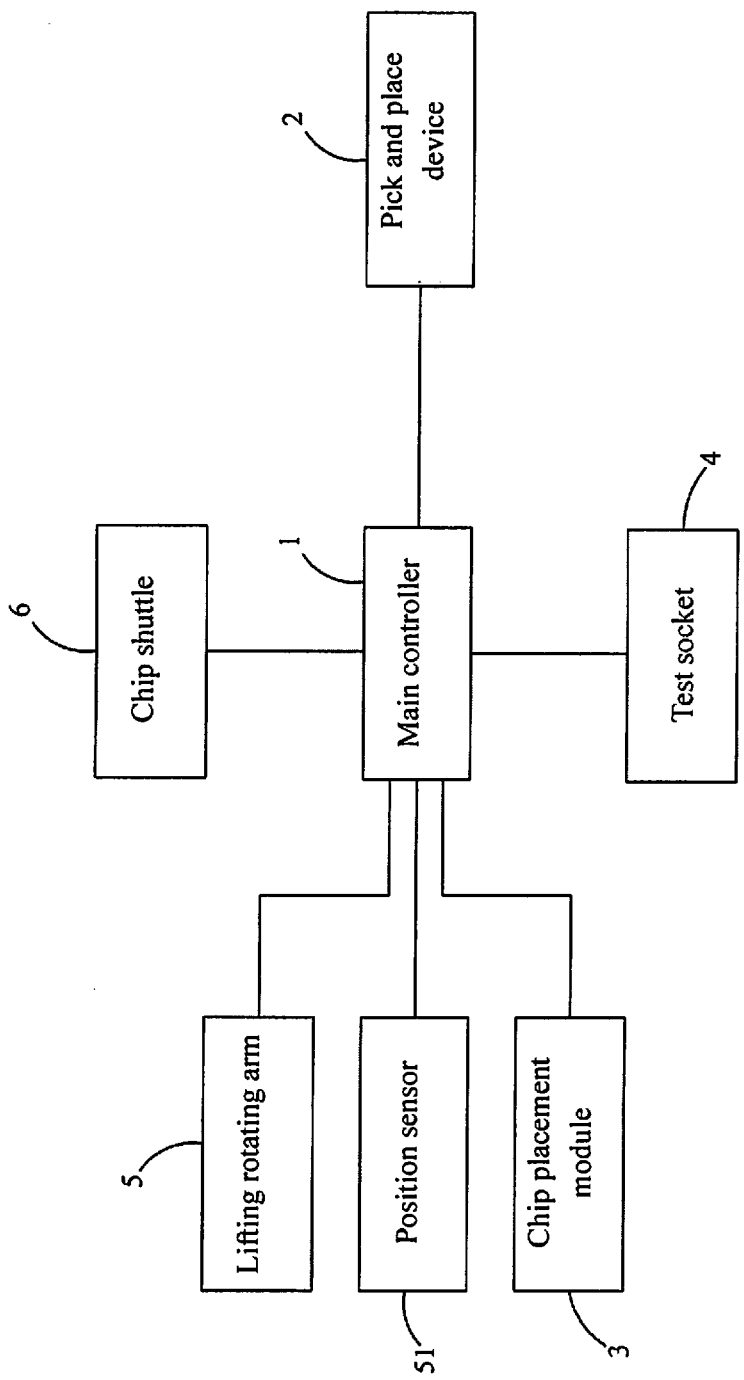
FIG. 1 is a block diagram for a structure system of a preferred embodiment of the apparatus of the present invention.

In the following description of an apparatus for testing a package-on-package semiconductor device according to the present invention, the same elements are always designated by the same reference numerals.

Figure 2A:
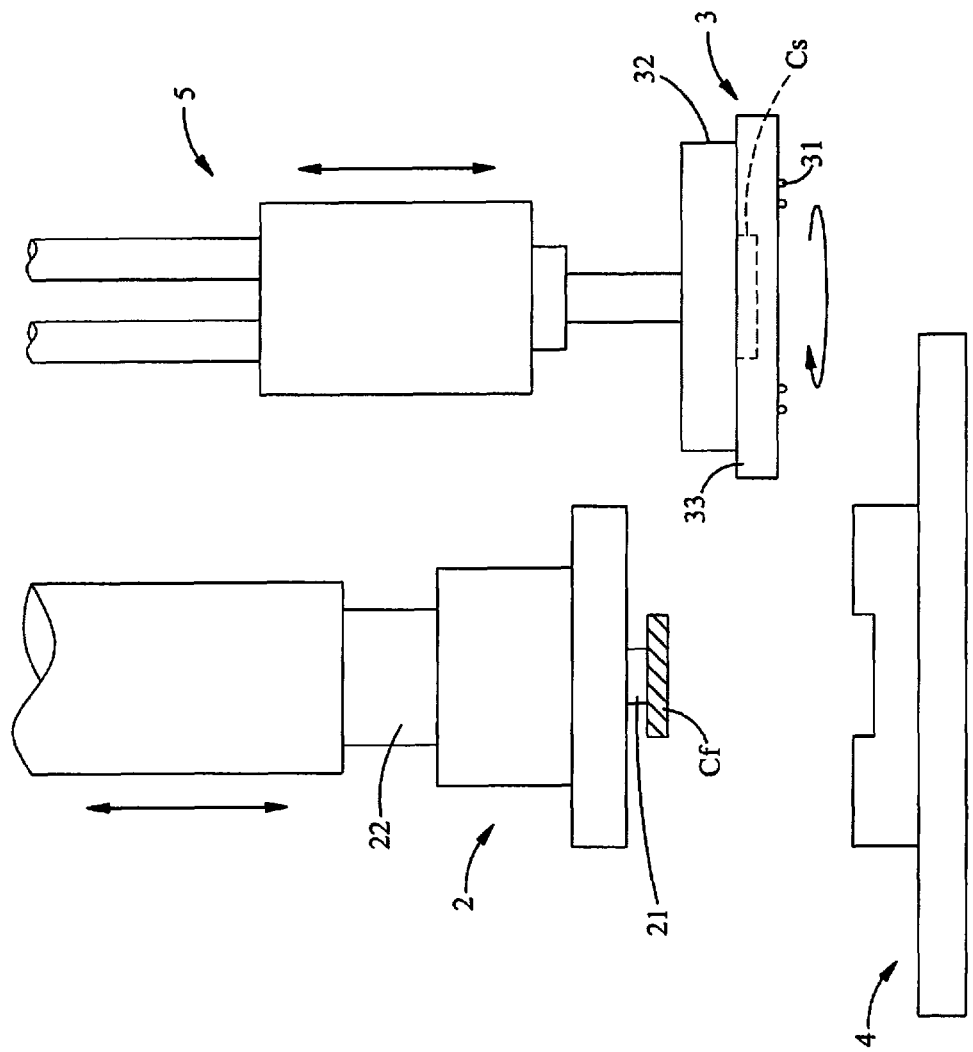
FIGS. 2A to 2C are schematic views showing the principle steps in testing a chip according to the preferred embodiment of the present invention.
Figure 2A:
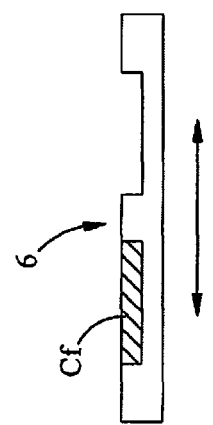
Figure 2B:
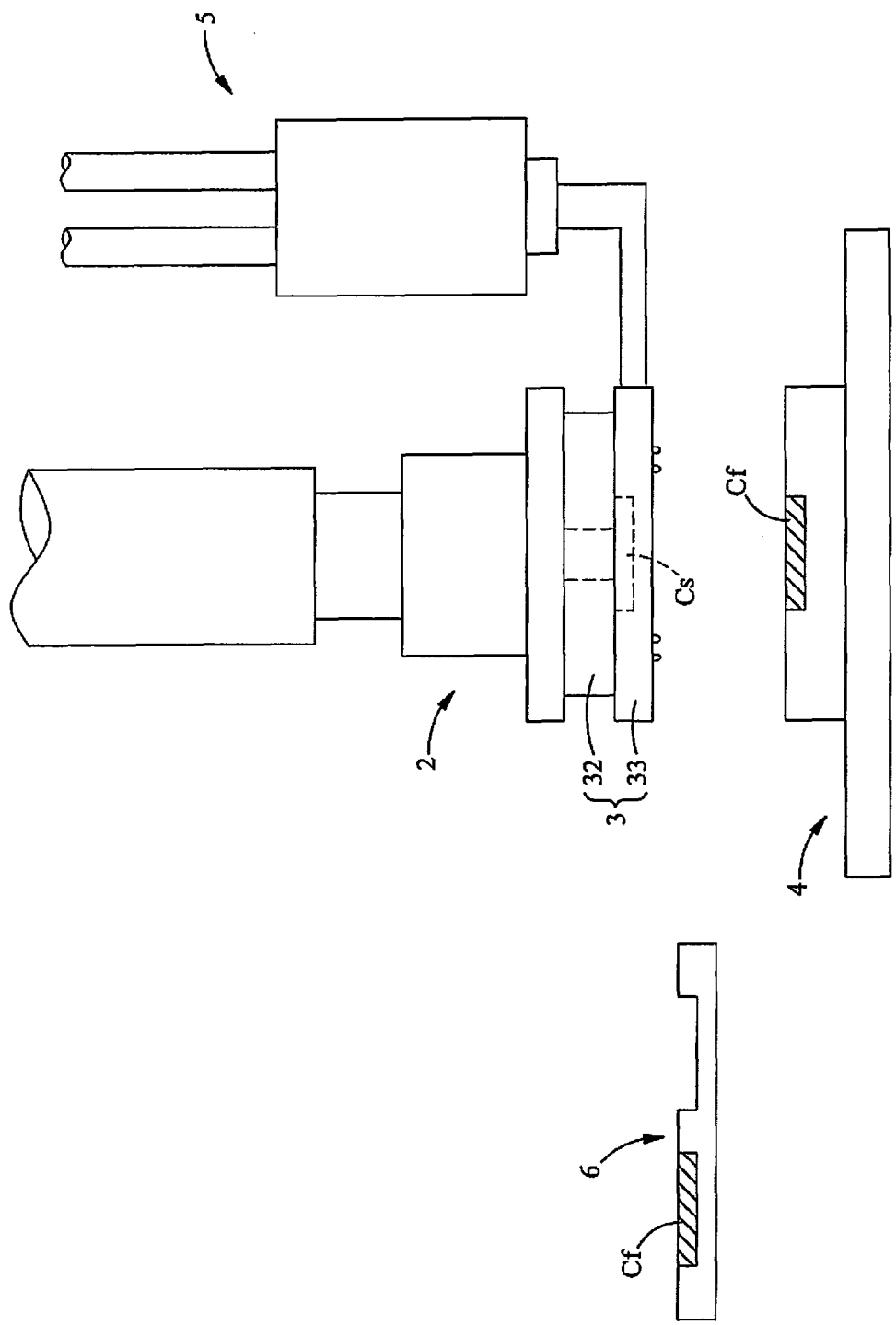
Figure 2C:
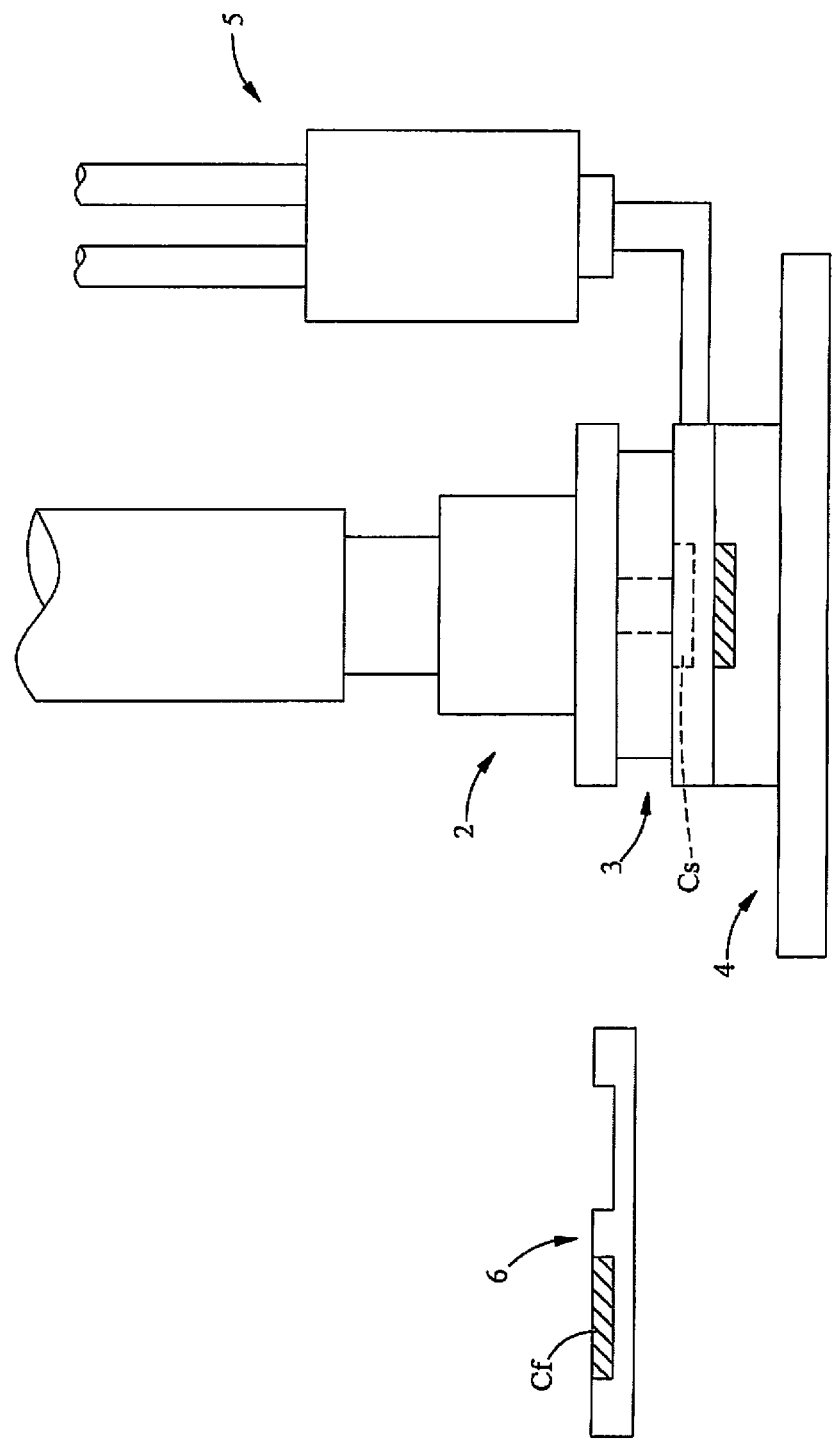
Figure 3:
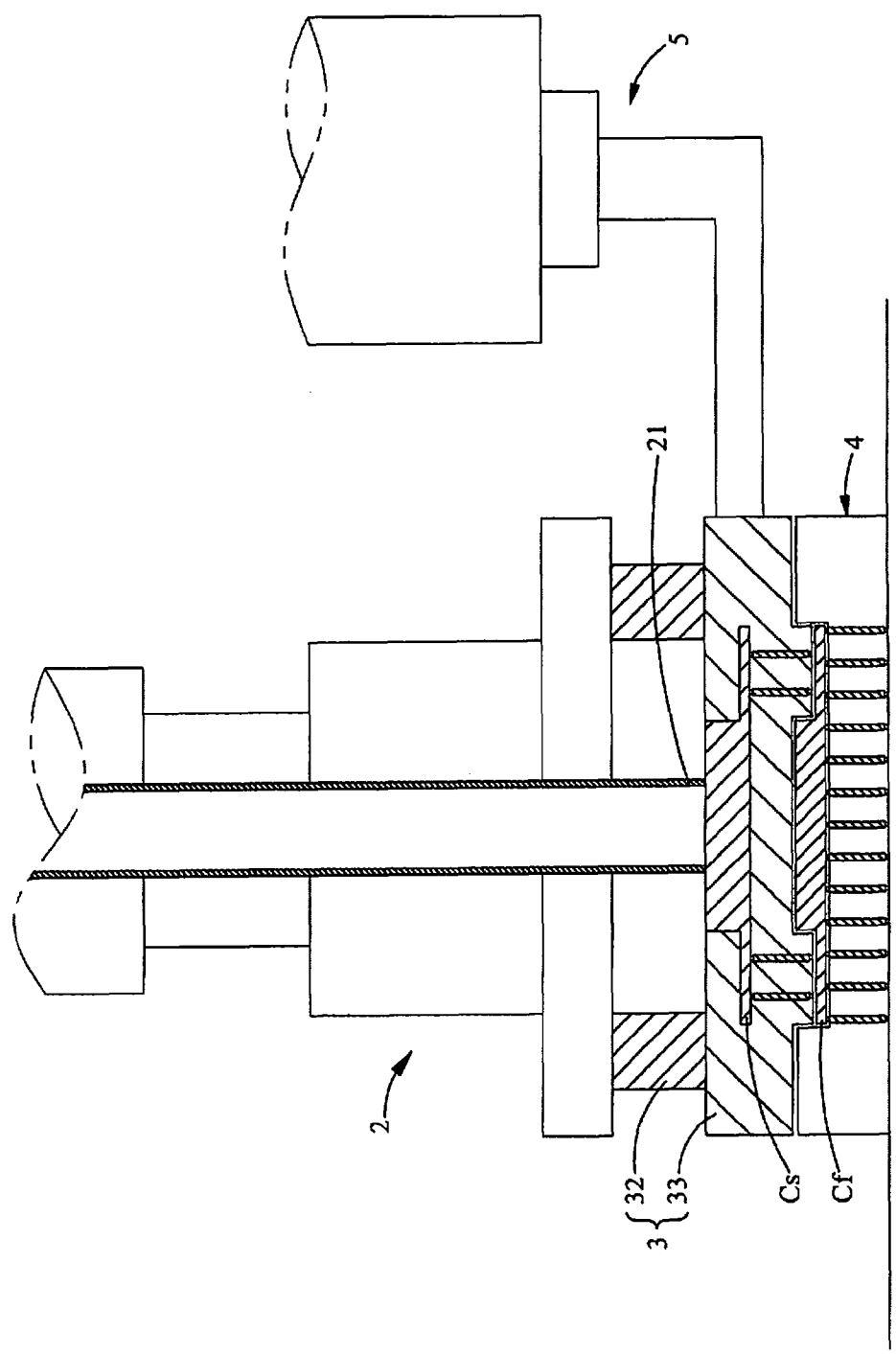
FIG. 3 is a cross-sectional view showing a related position to pick and place device, chip placement module, and test socket in a test state according to the preferred embodiment of the present invention.

With referring to FIG. 1, FIGS. 2A to 2C, and FIG. 3, FIG. 1 is a block diagram for a structure system of a preferred embodiment of the present invention. FIGS. 2A to 2C are schematic views showing a sequence of test steps in the preferred embodiment of the present invention, and FIG. 3 is a cross-sectional view showing a related position to pick and place device, chip placement module, and test socket in a test state according to the preferred embodiment of the present invention.

As shown in the figures, the apparatus for testing a package-on-package semiconductor device primarily comprises a main controller 1, a pick and place device 2, a chip placement module 3, a test socket 4, a lifting and rotating arm 5, and a chip shuttle 6, wherein the bottom surface of the pick and place device 2 is provided with a suction head 21, for sucking a first chip Cf which is to be tested or has been tested, or a second chip Cs. In addition, the pick and place device 2 is further provided with an air damper 22 located under the suction head 21. The air damper 22 is used as a cushion for buffering the influence caused by collision during the pick-and-place process or lift-and-lower process of the first chip Cf.

Furthermore, the test socket 4 is provided under the pick and place device 2, and is used to receive the first chip Cf to be tested. Moreover, the lifting and rotating arm 5 as shown in the figures, is located adjacent to the pick and place device 2, the lifting and rotating arm 5 being provided with the chip placement module 3 and a position sensor 51. The chip placement module 3 comprises a cushion 32 and a chip carrier 33, the cushion 32 being provided on the chip carrier 33, for carrying the second chip Cs thereon.

In the present embodiment, the second chip Cs is a memory chip without defect, and the first chip Cf is a functional chip to be tested. Moreover, the cushion 32 is used for buffering a collision between the pick and place device 2 and the chip placement module 3. On the other hand, the position sensor 51 is used to sense the actual position of the chip placement module 3 or the action or orientation of the lifting and rotating arm 5, and thereby assisting in positioning with the chip placement module 3.

Also, the chip shuttle 6, as shown in the figures, is used to carry the first chip Cf, which is to-be-tested or has already been tested. In detail, the chip shuttle 6 is controlled to move between the pick and place device 2 and the test socket 4, for the pick and place device 2 to pick up and release the first chip Cf, or move away therefrom for the purpose of performing a testing by the test socket 4, unload the tested first chip Cf or load a new first chip Cf to be tested. Although the drawings show only one chip shuttle 6, which carries the first chip Cf to be tested or the tested first chip Cf, yet the number of the shuttle is not limited. For example, two shuttles can be adopted to carry the first chip Cf to be tested or the tested first chip Cf, respectively, so as to enhance the carrying efficiency.

Furthermore, the main controller 1 is electrically connected with the pick and place device 2, the chip placement module 3, the test socket 4, the lifting and rotating arm 5, the position sensor 51, and the chip shuttle 6. The main controller 1 is responsible for controlling the pick and place device 2 to load the first chip Cf to be tested into or move it out of the test socket 4; the lifting and rotating arm 5 moves the chip placement module 3 to a position between the pick and place device 2 and the test socket 4 or adjacent to the pick and place device 2; the pick and place device 2 lowers together with the chip placement module 3 to electrically contact a plurality of contact terminals 31 to the first chip Cf on the test socket 4 for the purpose of performing test. For the present embodiment, there shows only one main controller 1. However, separate independent controllers can be used for each device to be independently controlled.

Figure 4:
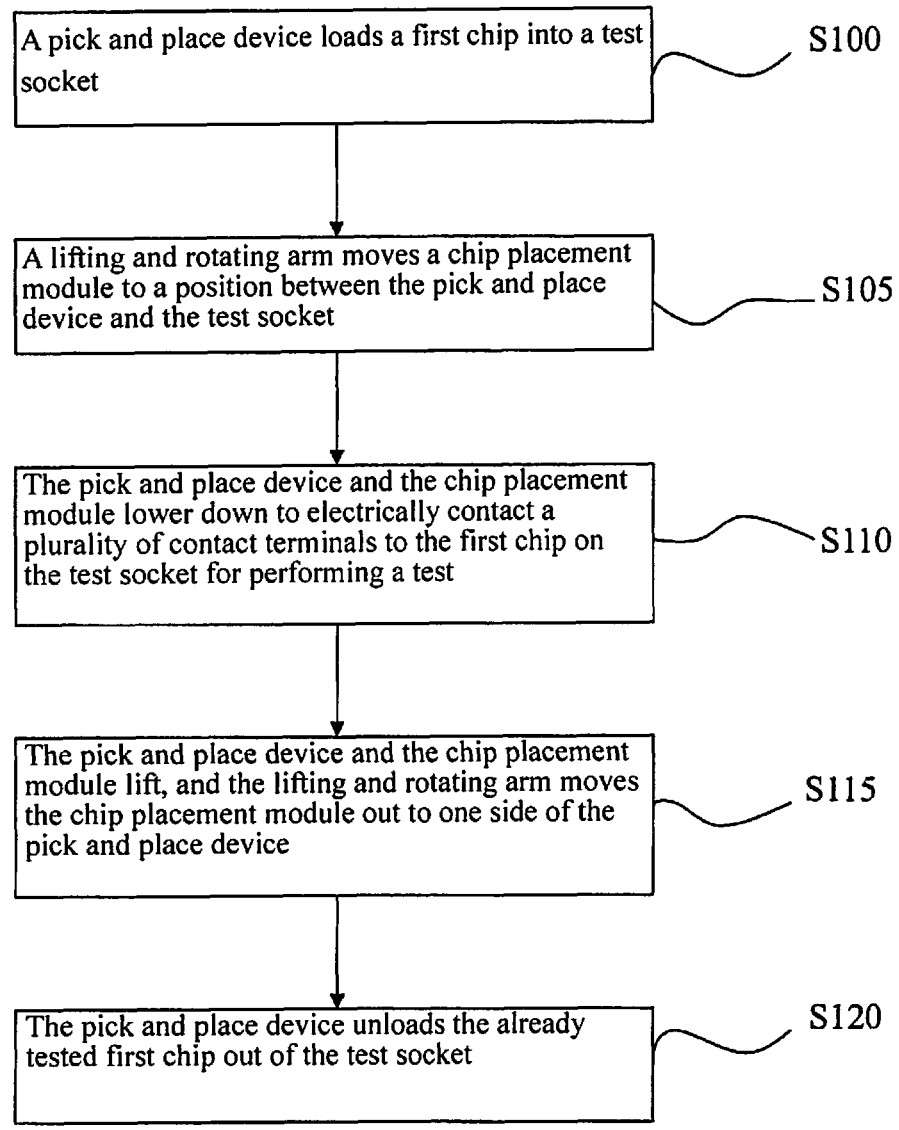
FIG. 4 is a flow chart for testing a chip according to the preferred embodiment of the present invention.
Figure 5:
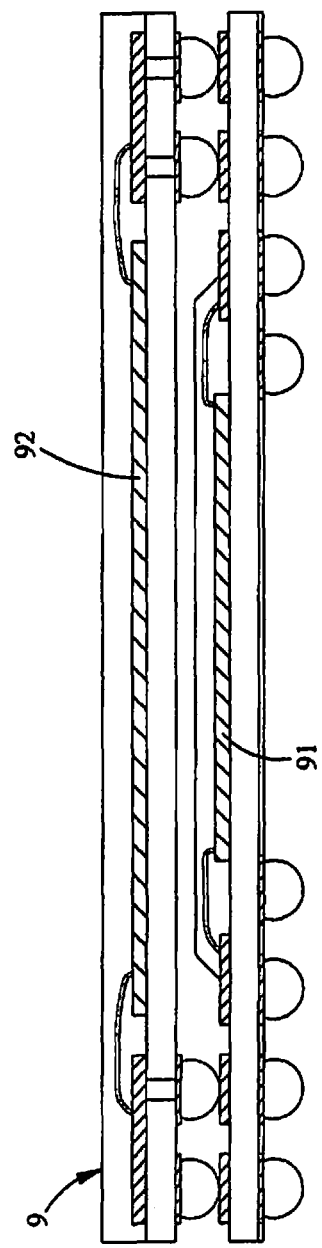
FIG. 5 is a schematic cross-sectional view showing a general configuration of a conventional kind of package on package semiconductor package.

FIG. 4 is a flow chart of the preferred embodiment of the present invention. As shown, the pick and place device 2 loads the first chip Cf to be tested into the test socket 4, i.e., step S100 shown in FIG. 4. In this step, first, the chip shuttle 6 carrying the first chips Cf to be tested is moved to a position between the pick and place device 2 and the test socket 4, where the pick and place device 2 suck the first chip Cf to be tested from the chip shuttle 6, as shown in FIG. 2A; then, the chip shuttle 6 is moved out, and the pick and place device 2 puts the first chip Cf down on the test socket 4.

After the pick and place device 2 loads the first chip Cf to be tested into the test socket 4, the pick and place device 2 lifts, and then, it proceeds to step S105. In step S105, the lifting and rotating arm 5 moves the chip placement module 3 to a position between the pick and place device 2 and the test socket 4. In this step, the lifting and rotating arm 5 lowers the chip placement module 3 and swings the chip placement module 3 to the position between the pick and place device 2 and the test socket 4; then, the lifting and rotating arm 5 further lifts the chip placement module 3 to join the bottom surface of the pick and place device 2, as shown in FIG. 2B.

At this time, the fact that the suction head 21 of the pick and place device 2 sucks the top surface of the second chip Cs, can be used to determine whether the chip placement module 3 joins the pick and place device 2 completely or not. In detail, if the chip placement module 3 does not join the pick and place device 2 completely, there must be a gap remaining between the top surface of the second chip Cs and the suction head 21, that is, they are not in a close fit to render a negative pressure around. Therefore, such a suction phenomenon can be used to determine whether a join between the chip placement module 3 and the pick and place device 2 is complete or not.

Next, if the chip placement module 3 accurately joints the pick and place device 2, it proceeds to step S110, that is the pick and place device 2 and the chip placement module 3 is to be lowered to the effect that the plurality of contact terminals 31 of the chip placement module 3 electrically contact to the first chip Cf on the test socket 4. That is, the pick and place device 2 lowers together with the chip placement module 3, so that the plurality of contact terminals 31 of the chip placement module 3 electrically contact the first chip Cf on the test socket 4 for performing a testing. Simultaneously, during the testing, the pick and place device 2, the chip placement module 3, and the test socket 4 are always held in a join state, as shown in FIG. 2C and FIG. 3.

After the testing is completed, it proceeds to step S115, that is, the pick and place device 2 lifts together with the chip placement module 3, and the lifting rotating arm 5 moves the chip placement module 3 to one side of the pick and place device 2. In this step, after the pick and place device 2 lifts together with the chip placement module 3, the suction head 21 fails to maintain the negative pressure and releases the second chip Cs; and then, the lifting rotating arm lowers the chip placement module 3 and rotate it to one side of the pick and place device 2.

Finally, in step S120, the pick and place device 2 lowers to unload the already tested first chip Cf from the test socket 4. In this step, first, the pick and place device 2 lifts after picking up the tested first chip Cf from the test socket 4; and then, the chip shuttle 6 is moved to a position between the pick and place device 2 and the test socket 4, where the pick and place device 2 places the tested first chip Cf on the chip shuttle 6, thereby accomplishing the whole chip testing process.

For convenient explanation, the above embodiment is exemplified only. The claimed scope of the present invention should be based on the following claims, and is not limited to the above embodiment.

What is claimed is:

1. An apparatus for testing a package-on-package semiconductor device, comprising:
   a pick and place device;
   a test socket for receiving a first chip, the test socket being located under the pick and place device;
   a lifting and rotating arm, located on one side of the pick and place device;
   a chip placement module, provided on the lifting and rotating arm, for receiving a second chip, a bottom surface of the chip placement module being provided with a plurality of contact terminals, the second chip being electrically connected to the plurality of contact terminals; and
   a main controller, electrically connected to the pick and place device, the test socket, the lifting and rotating arm, and the chip placement module;
   wherein the main controller is configured to control the pick and place device to load the first chip into or unload the same out of the test socket, control the lifting and rotating arm to move the chip placement module to a position between the pick and place device and the test socket or adjacent to the pick and place device and control the pick and place device to lower the chip placement module so that the plurality of contact terminals are brought into electrical contact with the first chip on the test socket for performing a test process.

2. The apparatus of claim 1, wherein a bottom surface of the pick and place device is provided with a suction head; and wherein the main controller is configured to control the chip placement module to move to the position between the pick and place device and the test socket so as to join the bottom surface of the pick and place device, and controls the suction head to suck the second chip.

3. The apparatus of claim 1, further comprising a position sensor, provided on the lifting and rotating arm and electrically connected to the main controller, for detecting the position of the chip placement module.

4. The apparatus of claim 1, further comprising a chip shuttle for carrying the first chip, the chip shuttle being electrically connected to the main controller, the main controller being configured to control the chip shuttle to move to the position between the pick and place device and the test socket or move away from the pick and place device.

5. The apparatus of claim 1, wherein the chip placement module comprises a cushion and a chip carrier, the cushion being provided on the chip carrier, and the second chip being received in the chip carrier.

6. The apparatus of claim 1, wherein the pick and place device further comprises an air damper, and the suction head is provided under the air damper.

7. A method for testing a package-on-package semiconductor device, comprising the steps of:
(A) loading a first chip into a test socket by a pick and place device;
(B) moving a chip placement module to a position between the pick and place device and the test socket by a lifting and rotating arm, the chip placement module receiving a second chip, a bottom surface of the chip placement module being provided with a plurality of contact terminals, and the second chip electrically being connected to the plurality of contact terminals;
(C) lowering the pick and place device and the chip placement module so that the plurality of contact terminals are electrically contacted to the first chip on the test socket for performing a test process;
(D) lifting the pick and place device and the chip placement module, and moving the chip placement module to one side of the pick and place device by the lifting and rotating arm; and
(E) unloading the first chip which is already tested out of the test socket by the pick and place device.

8. The method of claim 7, wherein the bottom surface of the pick and place device is provided with a suction head; and wherein in the step (B), the chip placement module is moved to the position between the pick and place device and test socket so as to join the bottom surface of the pick and place device, and the suction head sucks the second chip.

9. The method of claim 8, wherein in the step (B), the chip placement module is moved to the position between the pick and place device and the test socket by the lifting and rotating arm, and then the chip placement module is lifted to join the bottom surface of the pick and place device.

10. The method of claim 9, wherein in the step (D), after the pick and place device and the chip placement module are lifted, the chip placement module is lowered by the lifting and rotating arm so that the chip placement module is detached from the pick and place device and then moved to the one side of the pick and place device by the lifting and rotating arm.

* * * * *